United States Patent
Tawada et al.

(10) Patent No.: US 6,759,645 B2
(45) Date of Patent: Jul. 6, 2004

(54) HYBRID THIN-FILM PHOTOELECTRIC TRANSDUCER AND TRANSPARENT LAMINATE FOR THE TRANSDUCER

(75) Inventors: Yuko Tawada, Akashi (JP); Kenji Yamamoto, Kobe (JP)

(73) Assignee: Kaneka Corporation, Osaka (JP)

(*) Notice: Subject to any disclaimer, the term of this patent is extended or adjusted under 35 U.S.C. 154(b) by 165 days.

(21) Appl. No.: 10/181,841

(22) PCT Filed: Jan. 29, 2001

(86) PCT No.: PCT/JP01/00586

§ 371 (c)(1),
(2), (4) Date: Jul. 19, 2002

(87) PCT Pub. No.: WO01/57933

PCT Pub. Date: Aug. 9, 2001

(65) Prior Publication Data

US 2003/0010900 A1 Jan. 16, 2003

(30) Foreign Application Priority Data

Feb. 4, 2000 (JP) ........................ 2000-027840

(51) Int. Cl.$^7$ .............................................. H01L 31/00
(52) U.S. Cl. .................................. 250/214.1; 136/244
(58) Field of Search ................... 250/214.1; 136/244, 136/258

(56) References Cited

U.S. PATENT DOCUMENTS 6,168,968 B1 * 1/2001 Umemoto et al. ............. 438/96

FOREIGN PATENT DOCUMENTS

| EP | 0 113 434 | 7/1984 |
|---|---|---|
| EP | 0 831 536 | 3/1998 |
| EP | 1 041 646 | 10/2000 |
| JP | 60-101979 | 6/1985 |
| JP | 1-236525 | 9/1989 |
| JP | 3-19374 | 1/1991 |
| JP | 5-75153 | 3/1993 |
| JP | 8-204217 | 8/1996 |
| JP | 9-129903 | 5/1997 |
| JP | 9-139515 | 5/1997 |
| JP | 10-283847 | 10/1998 |
| JP | 2000-252500 | 9/2000 |
| WO | WO99/25029 | 5/1999 |

* cited by examiner

Primary Examiner—Thanh X. Luu
(74) Attorney, Agent, or Firm—Hogan & Hartson LLP

(57) ABSTRACT

A hybrid-type thin film photoelectric converter includes a transparent electrode (12), at least one amorphous photoelectric conversion unit (20), at least one crystalline photoelectric conversion unit (30) and a backside electrode (40), successively stacked on a transparent glass substrate (11). The transparent electrode (12) has a thickness of more than 400 nm and less than 1000 nm. A transparent laminated body (10) including the glass substrate (11) and the transparent electrode (12) has a haze ratio of more than 2% and less than 10%.

14 Claims, 7 Drawing Sheets

0.5 μm

HYBRID THIN-FILM PHOTOELECTRIC TRANSDUCER AND TRANSPARENT LAMINATE FOR THE TRANSDUCER

TECHNICAL FIELD

The present invention relates to a semiconductor thin film photoelectric converter and a transparent laminated body used therefor, and more particularly to improvements in the performance of a hybrid-type thin film photoelectric converter as well as a transparent laminated body which can preferably be used therefor.

BACKGROUND ART

A semiconductor thin film photoelectric converter generally includes a first electrode, one or more semiconductor thin film photoelectric conversion units and a second electrode, successively laminated on a substrate having an insulating surface. One photoelectric conversion unit includes an i-type layer sandwiched by a p-type layer and an n-type layer. The i-type layer making up a major portion of a thickness of the photoelectric conversion unit is a substantially intrinsic semiconductor layer, mainly in which photoelectric conversion occurs.

Accordingly, the photoelectric conversion unit, no matter whether p and n conductivity type layers contained therein are amorphous or crystalline, will be referred to as an amorphous unit if a photoelectric conversion layer of i-type is amorphous, or referred to as a crystalline unit if the same is crystalline. Note that in this specification, the term "crystalline" also refers to those which partially include amorphous states, as commonly used in the technical field of the thin film photoelectric converter.

On the other hand, a p or n type conductivity type layer serves to produce a diffusion potential within the photoelectric conversion unit. Open-circuit voltage, which is one of important properties of the photoelectric converter, varies depending on a magnitude of the diffusion potential. These conductivity type layers, however, are inactive layers not directly contributing to photoelectric conversion, and light absorbed by impurities doped in the conductivity type layer will become a loss, not contributing to power generation. Therefore, the conductivity type layer is desirably minimized in thickness, on the precondition of producing a required diffusion potential.

When the thin film photoelectric converter is formed on a transparent insulating substrate such as a glass plate, the substrate can serve as a cover glass for surface protection of the photoelectric converter. Generally, a p-type layer having a relatively large band gap, an i-type photoelectric conversion layer, and an n-type layer having a relatively small band gap are successively laminated on a transparent electrode formed on the glass substrate.

As a method of improving conversion efficiency of the thin film photoelectric converter, more than one photoelectric conversion units are stacked to constitute a tandem-type converter. In this method, a front unit including a photoelectric conversion layer having a large band gap is arranged on a light incident side of the photoelectric converter, and behind the same, a rear unit including a photoelectric conversion layer (made of Si—Ge alloy, for example) having a small band gap is successively arranged. This enables photoelectric conversion in a wide wavelength range of incident light, and thus conversion efficiency of the entire converter is improved. Among the tandem-type thin film photoelectric converters, one including both an amorphous photoelectric conversion unit and a crystalline photoelectric conversion unit stacked is called a hybrid-type thin film photoelectric converter.

For example, an i-type amorphous silicon can photoelectrically convert light having a wavelength of up to about 800 nm on a longer wavelength side, while an i-type crystalline silicon can photoelectrically convert light having a wavelength of up to about 1100 nm, which is longer than the former. Accordingly, when the hybrid-type thin film photoelectric converter is formed on the glass substrate, a transparent electrode, at least one amorphous unit, at least one crystalline unit and a backside electrode are stacked thereon in this order.

Such a hybrid-type thin film photoelectric converter can exhibit a significantly higher photoelectric conversion efficiency than a single-type thin film photoelectric converter including either a single amorphous photoelectric conversion unit or a single crystalline photoelectric conversion unit. The hybrid-type thin film photoelectric converter with such a high performance, however, is still considered to have a room for further improvement in the performance.

An object of the present invention is to provide a hybrid-type thin film photoelectric converter having a further improved photoelectric conversion property as well as a transparent laminated body which can preferably be used therefor.

DISCLOSURE OF THE INVENTION

A hybrid-type thin film photoelectric converter according to one aspect of the present invention includes a transparent electrode, at least one amorphous photoelectric conversion unit, at least one crystalline photoelectric conversion unit and a backside electrode, successively stacked on a transparent glass substrate. The transparent electrode has a thickness of more than 400 nm and less than 1000 nm. A transparent laminated body consisting of the glass substrate and the transparent electrode has a haze ratio of more than 2% and less than 10%.

In such a hybrid-type thin film photoelectric converter, preferably, the amorphous photoelectric conversion unit has a thickness of more than 80 nm and less than 350 nm, and the crystalline photoelectric conversion unit has a thickness of more than 1 μm and less than 5 μm.

A crystalline photoelectric conversion layer included in the crystalline photoelectric conversion unit preferably includes a columnar crystal structure along a direction of thickness thereof. In addition, the columnar crystal preferably extends preferentially along a crystal direction <110>.

The backside electrode preferably includes a transparent conductive oxide layer and a metal layer successively laminated. The transparent conductive oxide layer preferably has a thickness of more than 70 nm and less than 100 nm.

The photoelectric conversion layers included in the amorphous photoelectric conversion unit and the crystalline photoelectric conversion unit can be formed with silicon or silicon-germanium alloy.

A transparent laminated body according to another aspect of the present invention is provided for use in the hybrid-type thin film photoelectric converter as described above. The transparent laminated body includes a glass substrate and a transparent conductive layer formed thereon having a thickness of more than 400 nm and less than 1000 nm, and has a haze ratio of more than 2% and less than 10%.

BEST MODES FOR CARRYING OUT THE INVENTION

In the following, an embodiment of the present invention will be described with reference to the prior art.

When a semiconductor photoelectric conversion layer is of a thin film, light in a longer wavelength range, in which absorption coefficient is small, is not sufficiently absorbed, and an amount of photoelectric conversion in the photoelectric conversion layer is restricted by a film thickness thereof. Therefore, in order to make more use of light entering a photoelectric conversion unit, an uneven surface (a textured surface) structure is generally provided for a transparent electrode on a light incident side transparent glass substrate, so as to scatter light into the photoelectric conversion unit as well as to irregularly reflect again the light reflected by a backside metal electrode.

In a transparent laminated body consisting of such a transparent glass substrate and a transparent electrode, a haze ratio and a total transmittance thereof have a close relation with the uneven surface structure of the transparent electrode. As such a transparent laminated body for a thin film photoelectric converter, Japanese Patent Laying-Open No. 9-129903 (see paragraph [0051]) recommends a use of one having a haze ratio of 15%; Japanese Patent Laying-Open No. 9-139515 (see paragraphs [0022] and [0028]) recommends one having a haze ratio of 12 to 15%; and Japanese Patent Laying-Open No. 10-283847 (see paragraph [0029]) recommends one having a haze ratio of 10–30%.

In other words, conventionally, one having a haze ratio of 10% or larger has been used for the transparent laminated body for the thin film photoelectric converters, while one having a haze ratio of less than 10% has not been used.

The inventors, however, have found that, in a hybrid-type thin film photoelectric converter, a photoelectric conversion property can be improved by using a transparent laminated body having a haze ratio of less than 10%.

Figure 1:
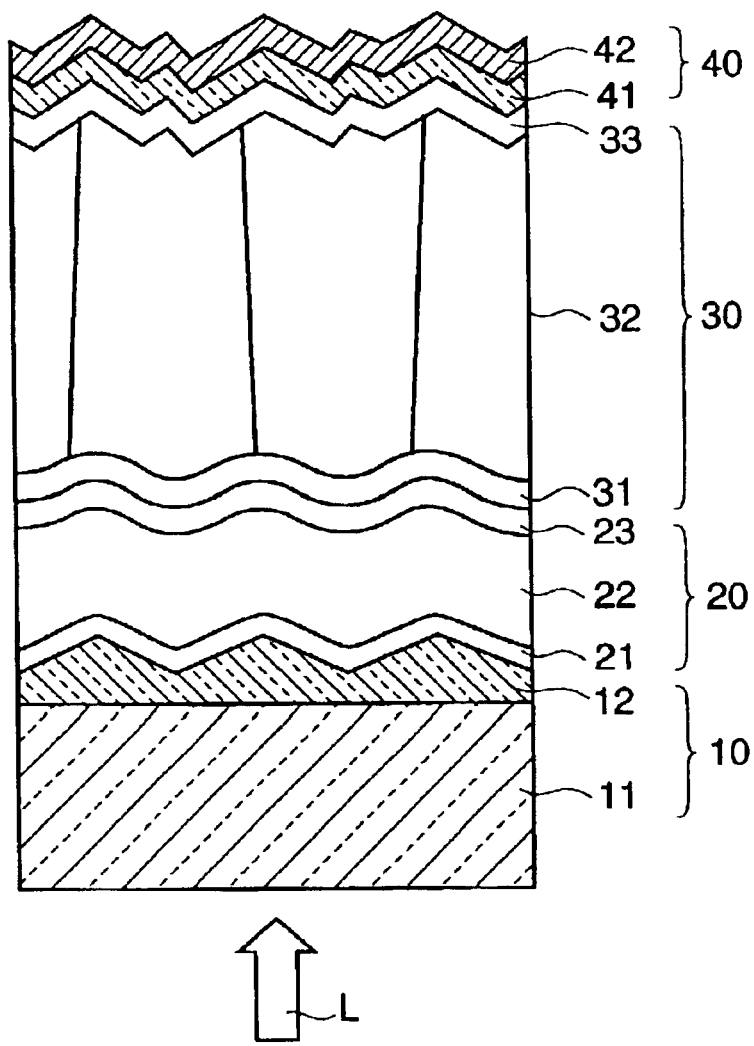
FIG. 1 is a schematic cross-sectional view showing a stacked structure in a hybrid-type thin film photoelectric converter in accordance with an embodiment of the present invention.

In FIG. 1, an example of a hybrid-type thin film photoelectric converter according to an embodiment of the present invention is shown in a schematic cross-sectional view. The photoelectric converter includes a transparent electrode 12 of transparent conductive oxide (TCO) formed on a transparent glass substrate 11. Tin oxide, indium tin oxide (ITO), zinc oxide or the like can be used as TCO.

Transparent electrode 12 has an uneven surface (a textured surface) structure including prescribed fine unevenness. The geometry of fine unevenness included in such a textured surface structure can be adjusted by varying an amount of fluorine mixed in a CVD reaction gas when depositing a tin oxide electrode 12 on glass substrate 11 with thermal CVD.

A transparent laminated body 10 including transparent glass substrate 11 and transparent electrode 12 has a haze ratio of more than 2% and less than 10%, and preferably more than 3% and less than 6%, with respect to incident light L. Here, the haze ratio is expressed as (transmittance of diffused ray/total ray transmittance)×100. It will readily be understood that the haze ratio of such transparent laminated body 10 depends mainly on the uneven surface structure of transparent electrode 12.

With regard to transparent laminated body 10, larger haze ratio is considered to be preferable so as to diffuse and enter light into the photoelectric conversion unit. It goes without saying, however, that larger total transmittance is preferred in terms of an amount of light entering the same. Here, when the haze ratio is increased, diffused transmitted light tends to increase, but diffused reflected light also tends to increase, resulting in lower total transmittance. In other words, if substrate 11 is in the same condition, total transmittance of transparent laminated body 10 tends to decrease as the haze ratio becomes larger.

The haze ratio of transparent laminated body 10 depends not only on average level difference of fine unevenness included in the textured surface structure of transparent electrode 12 but also on its unevenness pitch. In order to have the haze ratio of more than 2% and less than 10%, however, the average level difference is desirably in a range of 30 to 150 nm. This is because, if the average level difference of the uneven surface structure of transparent electrode 12 is too large, defects may be caused in a semiconductor junction between a conductivity type layer and a photoelectric conversion layer included in the photoelectric conversion unit adjacent to the electrode, and in contrast, if the average level difference is too small, a desired haze ratio cannot be obtained.

Transparent electrode 12 preferably has a thickness of 400 to 1000 nm, and more preferably, 600 to 800 nm. This is because too thin transparent electrode 12 would make it difficult to grow a desired uneven surface structure and is not preferable in terms of electric resistance in a film surface direction of the electrode, while total transmittance of transparent laminated body 10 is lowered if it is too thick.

An amorphous photoelectric conversion unit 20, a crystalline photoelectric conversion unit 30 and a backside electrode 40 are successively stacked on transparent electrode 12. Amorphous photoelectric conversion unit 20 and crystalline photoelectric conversion unit 30 can be formed, for example, with silicon, silicon germanium, silicon carbide or the like, and preferably have a thickness of 80 to 350 nm and a thickness of 1 to 5 $\mu$m respectively, in terms of light absorption property, time and cost for forming with plasma CVD, and the like.

Amorphous photoelectric conversion unit 20 includes one conductivity type layer 21 and the opposite conductivity type layer 23 sandwiching a substantially intrinsic amorphous photoelectric conversion layer 22. Crystalline photoelectric conversion unit 30 also includes one conductivity type layer 31 and the opposite conductivity type layer 33 sandwiching a substantially intrinsic crystalline photoelectric conversion layer 32. Each of conductivity type layers 21, 23, 31, 33 may be much thinner than photoelectric conversion layers 22, 32, and may be, for example, about 10 nm thick. If desired, however, each of the conductivity type layers may be made thicker about up to 30 nm.

Backside electrode 40 preferably includes a TCO layer 41 and a metal layer 42 successively laminated. Any metal may be used for metal layer 42, provided that it has good conductive and light reflective properties, and in general, silver is preferably used. TCO layer 41 can serve to enhance efficiency with which metal layer 42 reflects light transmitted through photoelectric conversion units 20, 30 and also serve to prevent metal atoms from diffusing into photoelectric conversion units 30, 20 from metal layer 42. TCO layer 41 preferably has a thickness of 70 to 100 nm. This is because TCO layer 41 cannot sufficiently exhibit the above-mentioned function if it is too thin, and electric resistance in a direction of thickness and loss of light absorption will increase if it is too thick.

When crystalline photoelectric conversion layer 32 included in crystalline photoelectric conversion unit 30 is formed with a silicon-based material containing silicon as a main component, as disclosed in Japanese Patent Laying-Open No. 11-145499, a columnar crystal structure preferentially having a crystal direction <110> along a direction of thickness can be obtained, using a source gas containing a silane gas and a hydrogen dilution gas of more than 50 times the silane gas in plasma CVD under a relatively high pressure more than 400Pa (3Torr). In this example, as shown in FIG. 1, the top surface of crystalline photoelectric conversion layer 32 is superposed not only with the unevenness due to the textured surface structure of transparent electrode 12 but also with unevenness due to the columnar crystal structure. Consequently, the bottom surface of light-reflective metal layer 42 also has a fine uneven surface structure. An effect of light reflection and diffusion therefrom can serve to further enhance light absorption efficiency in photoelectric conversion units 30, 20.

In the above embodiment, although a hybrid-type thin film photoelectric converter having one amorphous photoelectric conversion unit and one crystalline photoelectric conversion unit stacked has been described, it goes without saying that the present invention is applicable to one including one or more amorphous photoelectric conversion units and one or more crystalline photoelectric conversion units.

In the following, a hybrid-type thin film photoelectric converter according to an example corresponding to the embodiment of FIG. 1 will be described along with a comparative example.

COMPARATIVE EXAMPLE

Figure 2:
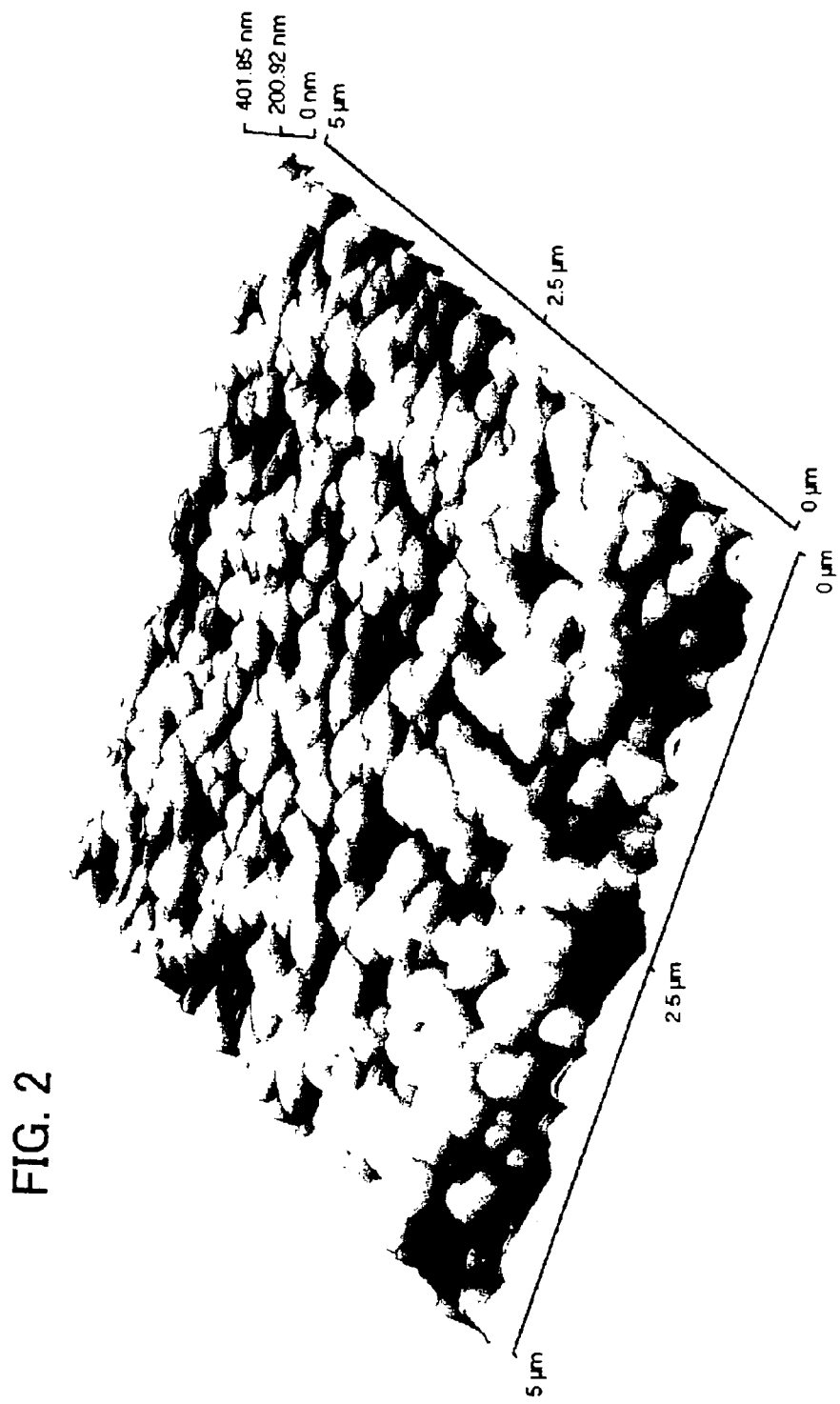
FIG. 2 is an atomic force micrograph (AFM) showing an uneven surface structure of a transparent electrode included in a thin film photoelectric converter in a comparative example.

In a hybrid-type thin film photoelectric converter of a comparative example corresponding to FIG. 1, a transparent laminated body 10 has included a transparent glass substrate 11 and a transparent tin oxide electrode 12 with a thickness of about 600 nm formed thereon by thermal CVD. Transparent laminated body 10 in the comparative example had a haze ratio of 12.7% and a total transmittance of 80.8%. A top surface of tin oxide electrode 12 had an uneven surface structure as shown in an atomic force micrograph (AFM) of FIG. 2. As can be seen in FIG. 2, a textured surface structure of tin oxide electrode 12 includes a pyramid-like shape having a relatively angular vertex.

Figure 3:
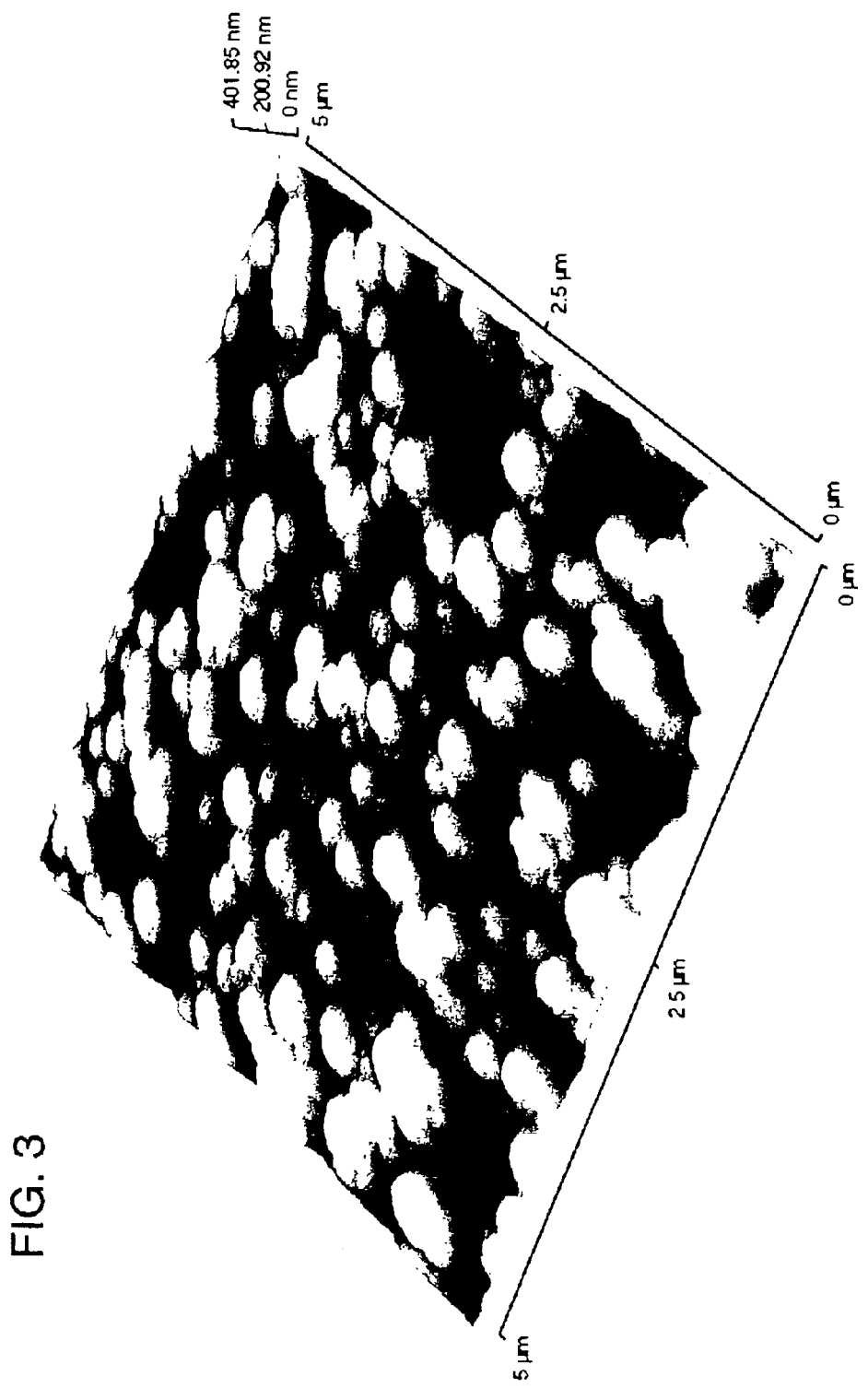
FIG. 3 is an atomic force micrograph showing an uneven surface structure on a top surface of an amorphous photoelectric conversion unit included in the thin film photoelectric converter according to the comparative example.

On tin oxide electrode 12, an amorphous silicon photoelectric conversion unit 20 with a thickness of about 300 nm was formed by plasma CVD. A p-type layer 21 and an n-type layer 23 included in this amorphous unit 20 were both made to a thickness of about 10 nm. The top surface of amorphous silicon photoelectric conversion unit 20 in the comparative example has an uneven surface structure as shown in an AFM of FIG. 3, and includes a dome-like shape having a relatively rounded vertex.

On amorphous silicon photoelectric conversion unit 20, a crystalline silicon photoelectric conversion unit 30 with a thickness of about 3.0 μm was formed by plasma CVD. A crystalline silicon photoelectric conversion layer 32 included in the crystalline unit preferentially had a crystal orientation <110> generally parallel to its thickness direction, and in X-ray diffraction thereof, a diffraction intensity ratio (111)/(220) of a (111) plain to a (220) plain was 0.78. In addition, a p-type layer 31 and an n-type layer 33 included in crystalline unit 30 were both formed to a thickness of about 10 nm.

On crystalline silicon photoelectric conversion unit 30, an ITO transparent conductive layer 41 with a thickness of about 80 nm and a silver layer 42 with a thickness of about 400 nm were formed by a sputtering method.

EXAMPLE

A hybrid-type thin film photoelectric converter of an example corresponding to FIG. 1 was different from that of the comparative example only in that a transparent laminated body 10 had a haze ratio of 3% and a total transmittance of 85.9%. In other words, an amorphous silicon photoelectric conversion unit 20, a crystalline silicon photoelectric conversion unit 30 and a backside electrode 40 in the example were formed with exactly the same method and deposition condition as in the comparative example.

Figure 4:
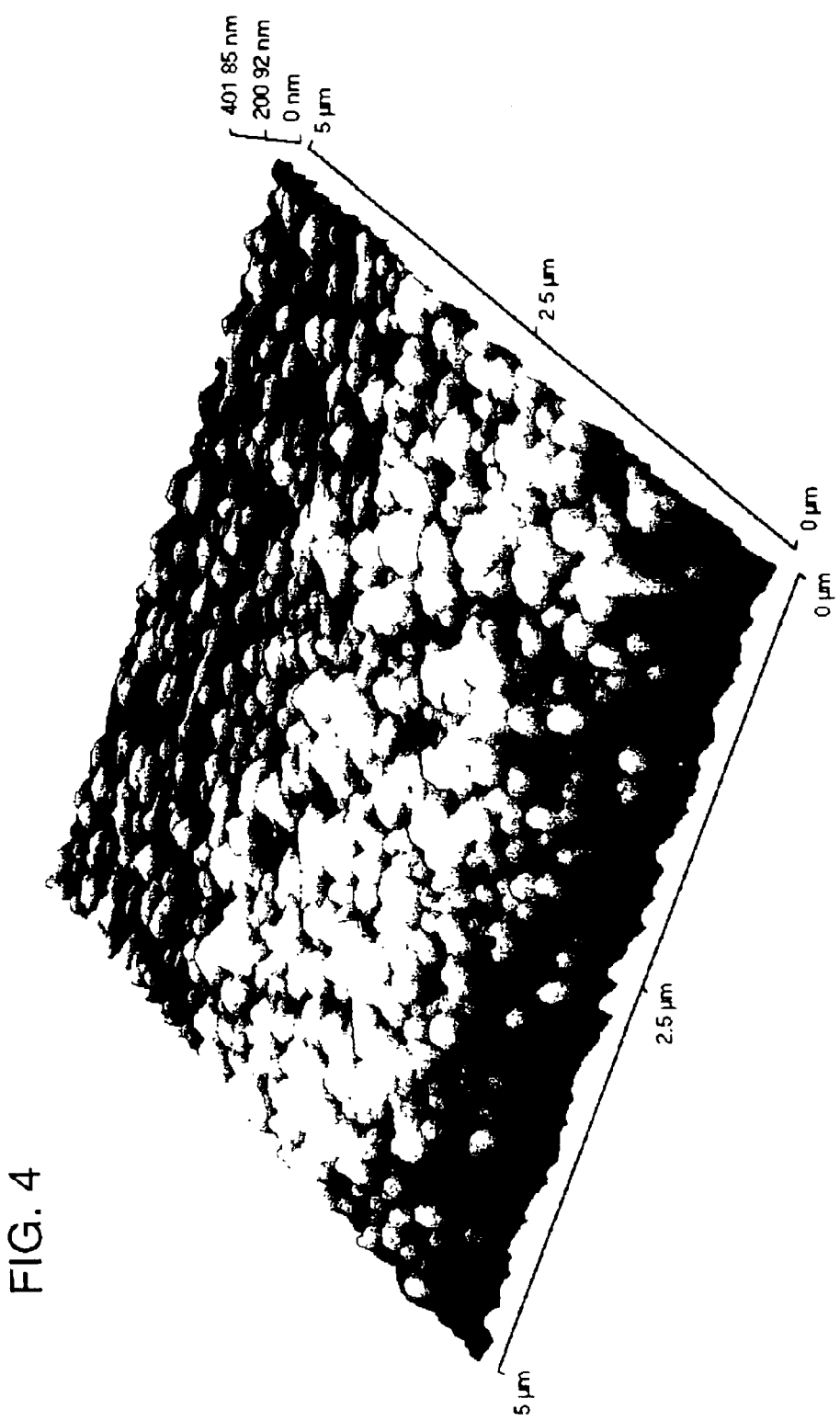
FIG. 4 is an atomic force micrograph showing an uneven surface structure of a transparent electrode included in the thin film photoelectric converter in an example of the present invention.

FIG. 4 is an AFM showing a textured surface structure of a tin oxide electrode 12 in the present example. In comparison of FIG. 4 with FIG. 2, tin oxide electrode 12 in the example having the haze ratio of 3.0% has a finer uneven surface structure than in the comparative example having the haze ratio of 12.7%. Similarly, an AFM of FIG. 5 shows an uneven surface structure on the top surface of amorphous silicon photoelectric conversion unit 20 deposited on tin oxide electrode 12 having the textured surface structure as shown in FIG. 4.

Figure 5:
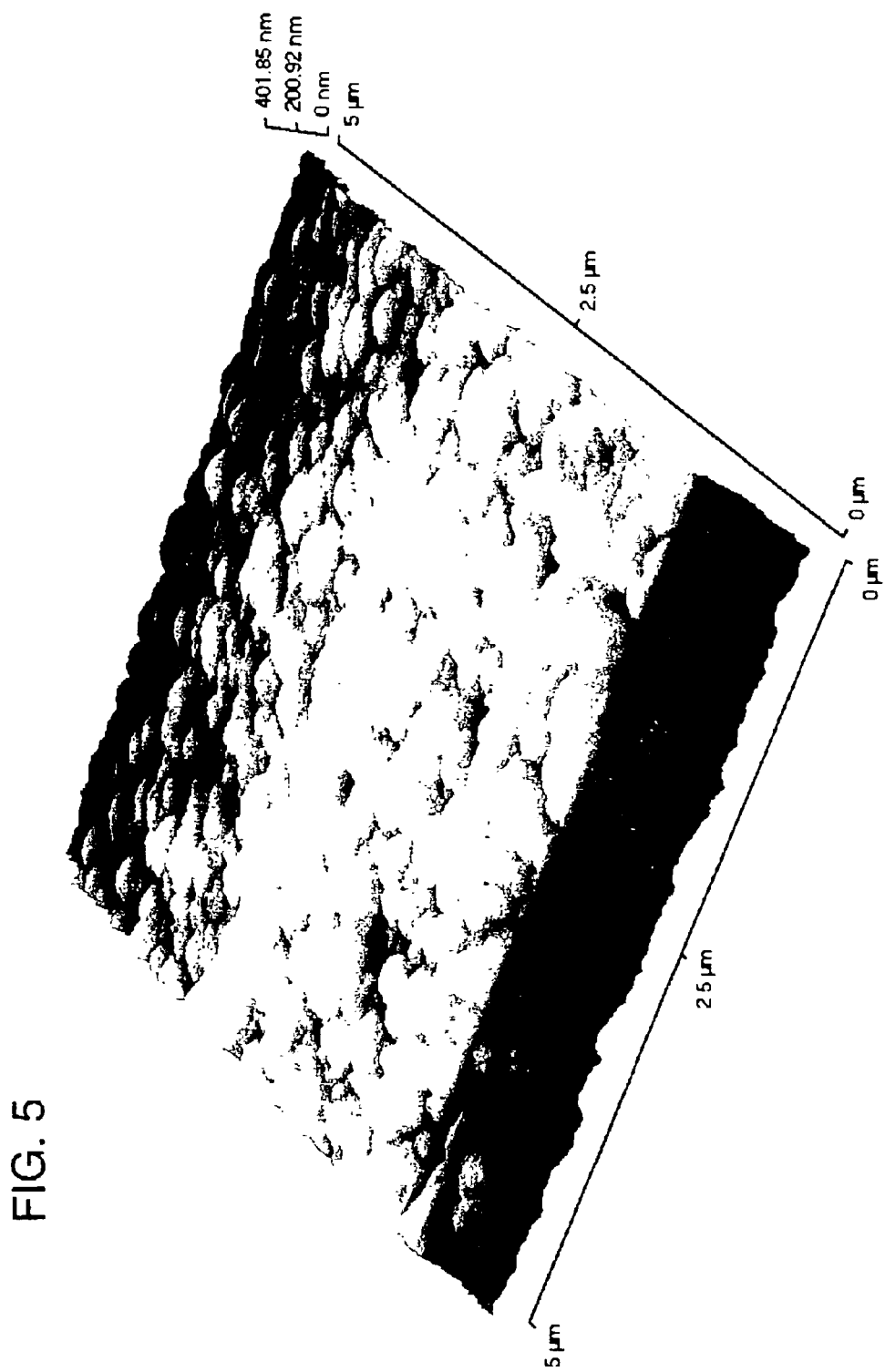
FIG. 5 is an atomic force micrograph showing an uneven surface structure on a top surface of an amorphous photoelectric conversion unit included in the thin film photoelectric converter in the example of the present invention.

Crystalline silicon photoelectric conversion unit 30 in the example was formed on amorphous unit 20 having the textured surface structure as shown in FIG. 5, under the same deposition condition as in the comparative example. However, a crystalline silicon photoelectric conversion layer 32 included in crystalline unit 30 had an X-ray diffraction intensity ratio (111)/(220) of 0.56, which was smaller than 0.78 of the comparative example. This is considered to represent a high preferential crystal orientation <110> along a direction of thickness in a columnar crystal structure included in crystalline silicon photoelectric conversion layer 32 in the example, resulting from difference in an uneven surface structures of amorphous unit 20 underlying crystalline unit 30 as compared with the comparative example.

Figure 6:
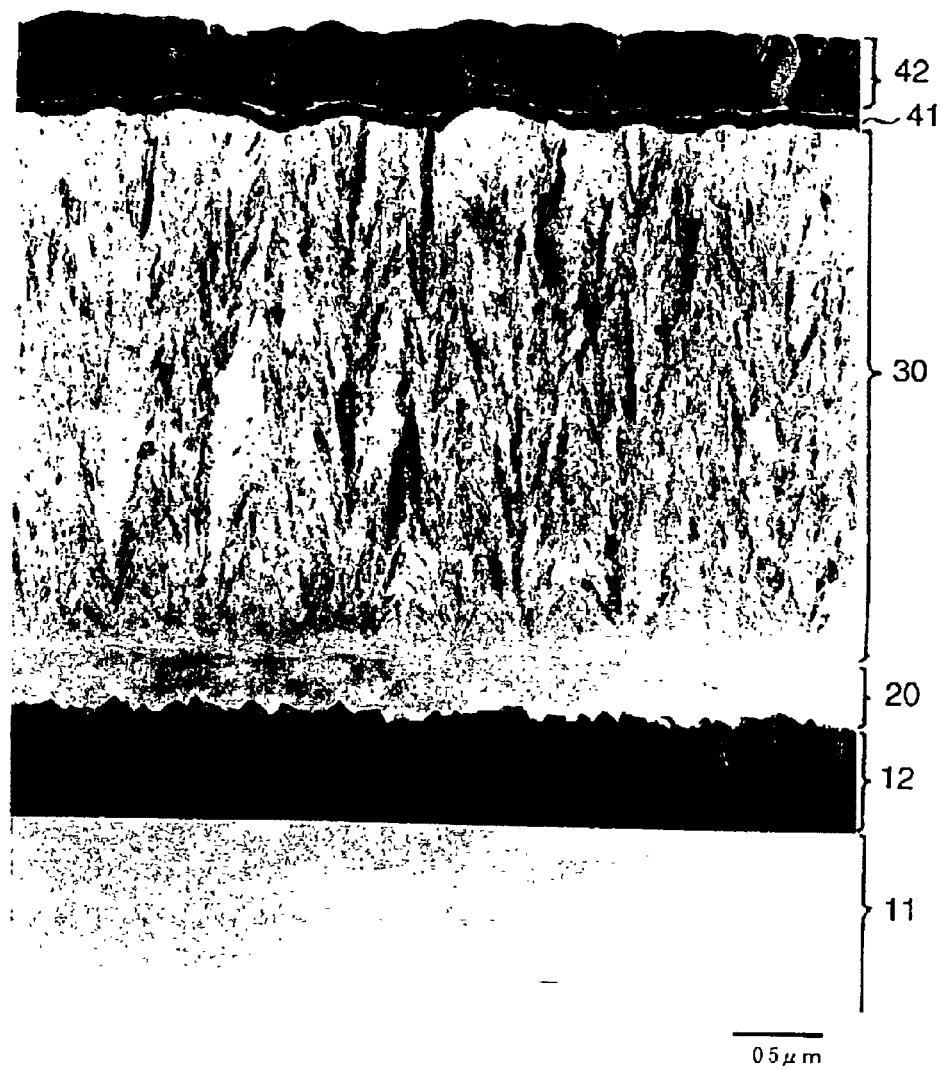
FIG. 6 is a transmission electron micrograph (TEM) showing a cross-sectional stacked structure of the thin film photoelectric converter in the example of the present invention.

FIG. 6 is a transmission electron micrograph (TEM) showing a cross-sectional stacked structure of a hybrid-type thin film photoelectric converter in the example. A black line segment in the bottom part of this micrograph represents a length of 0.5 μm. In the TEM, white lines between amorphous unit 20 and crystalline unit 30 and between ITO transparent conductive layer 41 and silver layer 42 are considered to represent local interlayer separation caused during preparation of a thin sample piece for TEM. It is also observed that crystal nuclei are not readily generated in crystalline unit 30, because amorphous unit 20 underlies, and that amorphous portions locally remain to a certain small thickness. After the start of crystallization, however, development of a columnar crystal structure along the direction of thickness is clearly observed.

COMPARISON BETWEEN COMPARATIVE EXAMPLE AND EXAMPLE

In the hybrid-type thin film photoelectric converters according to the comparative example and the example as described above, when normalized with the short-circuit current density Jsc of the comparative example being 1, Jsc in the example was improved to 1.06.

Figure 7:
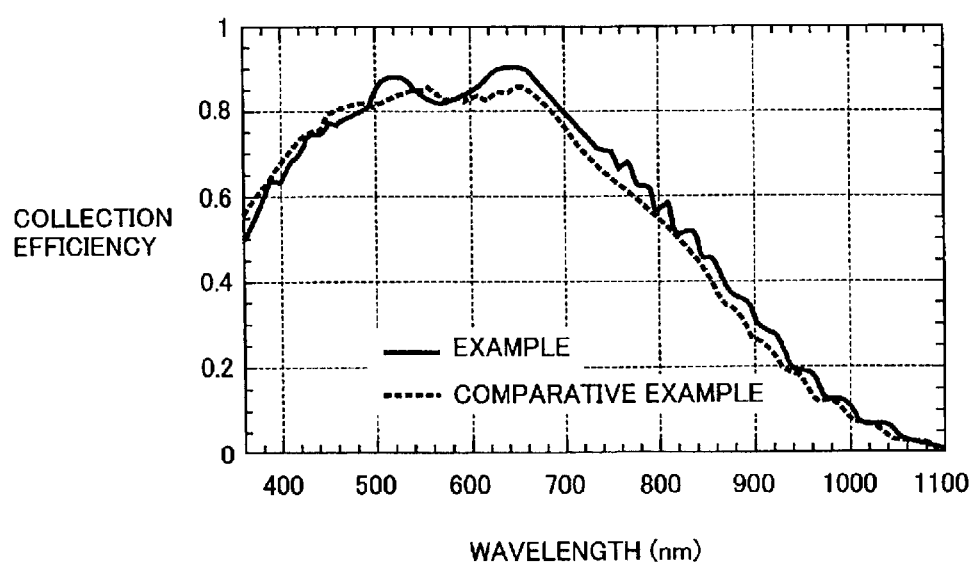
FIG. 7 is a graph showing dependency of light quantum collection efficiency on light wavelength in the thin film photoelectric converters according to the comparative example and the example.

FIG. 7 shows relationship between light wavelength and light quantum collection efficiency in the photoelectric converters of the comparative example and the example. That is, a horizontal axis of this graph represents light wavelength (nm) and a vertical axis represents collection efficiency. Dashed and solid curves represent dependency of collection efficiency on wavelength in the comparative example and the example, respectively. As can clearly be seen from FIG. 7, luminous sensitivity has been improved in a long-wavelength region in the example, as compared with the comparative example.

At present, it is not very clear what has contributed to achieve the improvement in the example relative to the comparative example as described above. The reason is as follows. There are such many factors as light scattering effect by the uneven surface structure of transparent electrode 12 and the uneven reflecting surface of metal electrode layer 42, light scattering effect on the interface between the amorphous silicon and the crystalline silicon, and the total amount of transmitted light through transparent laminated body 10, that affect the photoelectric conversion properties of the hybrid-type thin film photoelectric converter, and thus it is difficult to quantitatively evaluate the effect of a combination thereof.

Although a transparent laminated body having a haze ratio more than 10%, which had conventionally been considered preferable, has been used for a thin film photoelectric converter only including one or more amorphous photoelectric conversion units, the inventors have found that a transparent laminated body having a haze ratio of less than 10% enable to obtain higher photoelectric conversion properties in a hybrid-type photoelectric converter.

INDUSTRIAL APPLICABILITY

As described above, the present invention can provide a hybrid-type thin film photoelectric converter having an improved photoelectric conversion properties compared with a conventional example as well as a transparent laminated body which can be preferably used therefor.

What is claimed is:

1. A hybrid-type thin film photoelectric converter, comprising:
    a transparent electrode (12);
    at least one amorphous photoelectric conversion unit (20);
    at least one crystalline photoelectric conversion unit (30); and
    a backside electrode (40), successively stacked on a transparent glass substrate (11); wherein
    said transparent electrode (12) has a thickness of more than 400 nm and less than 1000 nm; and
    said glass substrate (11) and said transparent electrode (12) make up a transparent laminated body (10) having a haze ratio of more than 2% and less than 10%.

2. The hybrid-type thin film photoelectric converter according to claim 1, wherein
    said amorphous photoelectric conversion unit (20) has a thickness of more than 80 nm and less than 350 nm, and said crystalline photoelectric conversion unit (30) has a thickness of more than 1 μm and less than 5 μm.

3. The hybrid-type thin film photoelectric converter according to claim 1, wherein
    said crystalline photoelectric conversion unit (30) includes a crystalline photoelectric layer (32) having a columnar crystal structure along a direction of thickness.

4. The hybrid-type thin film photoelectric converter according to claim 3, wherein
    said columnar crystal extends preferentially along a crystal direction <110>.

5. The hybrid-type thin film photoelectric converter according to claim 1, wherein
    said backside electrode (40) includes a transparent conductive oxide layer (41) and a metal layer (42) successively laminated.

6. The hybrid-type thin film photoelectric converter according to claim 5, wherein
    said transparent conductive oxide layer (41) has a thickness of more than 70 nm and less than 100 nm.

7. The hybrid-type thin film photoelectric converter according to claim 1, wherein
    said amorphous photoelectric conversion unit (20) and said crystalline photoelectric conversion unit (30) each include a photoelectric conversion layer (22, 32) mainly containing silicon or silicon germanium alloy.

8. A transparent laminated body (10) for use in a hybrid-type thin film photoelectric converter including a transparent electrode (12), at least one amorphous photoelectric conversion unit (20), at least one crystalline photoelectric conversion unit (30) and a backside electrode (40), successively stacked on a transparent glass substrate (11), comprising:
    a glass substrate (11); and
    a transparent conductive layer (12) formed on the substrate, having a thickness of more than 400 nm and less than 1000 nm, and having a haze ratio of more than 2% and less than 10%.

9. The transparent laminated body according to claim 8, wherein
    said amorphous photoelectric conversion unit (20) has a thickness of more than 80 nm and less than 350 nm, and said crystalline photoelectric conversion unit (30) has a thickness of at more than 1 μm and less than 5 μm.

10. The transparent laminated body according to claim 8, wherein
    said crystalline photoelectric conversion unit (30) includes a crystalline photoelectric conversion layer (32) having a columnar crystal structure along a direction of thickness.

11. The transparent laminated body according to claim 10, wherein
    said columnar crystal extends preferentially along a crystal direction <110>.

12. The transparent laminated body according to claim 8, wherein
    said backside electrode (40) includes a transparent conductive oxide layer (41) and a metal layer (42) successively laminated.

13. The transparent laminated body according to claim 12, wherein
    said transparent conductive oxide layer (41) has a thickness of more than 70 nm and less than 100 nm.

14. The transparent laminated body according to claim 8, wherein
    said amorphous photoelectric conversion unit (20) and said crystalline photoelectric conversion unit (30) each include a photoelectric conversion layer (22, 32) mainly containing silicon or silicon germanium alloy.

* * * * *